(12) United States Patent
Tandy

(10) Patent No.: US 6,392,289 B1
(45) Date of Patent: May 21, 2002

(54) INTEGRATED CIRCUIT SUBSTRATE HAVING THROUGH HOLE MARKINGS TO INDICATE DEFECTIVE/NON-DEFECTIVE STATUS OF SAME

(75) Inventor: Patrick W. Tandy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/292,395

(22) Filed: Apr. 15, 1999

(51) Int. Cl.$^7$ .................. H01L 23/02; H01L 23/495; H01L 23/04; H01L 23/48

(52) U.S. Cl. .................. 257/678; 257/431; 257/432; 257/433; 257/434; 257/435; 257/774; 257/680; 257/730; 257/81; 257/82; 174/524

(58) Field of Search .................. 257/678, 730, 257/731, 274, 680, 432, 433, 434, 435, 431, 81, 82; 174/52.4

(56) References Cited

U.S. PATENT DOCUMENTS

| | | | | |
|---|---|---|---|---|
| 2,635,393 A | * | 5/1953 | Birt et al. .................. 257/731 |
| 4,454,413 A | | 6/1984 | Morton, Jr. .................. 235/375 |
| 4,631,416 A | | 12/1986 | Trutna, Jr. .................. 250/548 |
| 4,787,143 A | | 11/1988 | Yagi et al. .................. 29/833 |
| 5,031,025 A | * | 7/1991 | Braun et al. .................. 257/731 |
| 5,122,737 A | * | 6/1992 | Clenberg .................. 324/158 R |
| 5,132,773 A | * | 7/1992 | Braden et al. .................. 257/702 |
| 5,159,433 A | * | 10/1992 | Kazami et al. .................. 257/681 |
| 5,357,056 A | * | 10/1994 | Nagano .................. 174/52.4 |
| 5,365,034 A | * | 11/1994 | Kawamura et al. .................. 219/121.83 |
| 5,371,408 A | * | 12/1994 | Moulton et al. .................. 257/730 |
| 5,546,206 A | * | 8/1996 | Nakanishi et al. .................. 359/67 |
| 5,616,949 A | * | 4/1997 | Watanabe .................. 257/434 |
| 5,673,028 A | * | 9/1997 | Levy .................. 340/635 |
| 5,736,781 A | * | 4/1998 | Atsumi .................. 257/679 |
| 5,739,584 A | * | 4/1998 | Pasch .................. 257/697 |
| 5,744,862 A | * | 4/1998 | Ishii .................. 257/693 |
| 5,774,254 A | * | 6/1998 | Berlin .................. 359/259 |
| 5,790,730 A | * | 8/1998 | Kravitz et al. .................. 385/49 |
| 5,793,117 A | * | 8/1998 | Shimada et al. .................. 257/780 |
| 5,793,519 A | * | 8/1998 | Furlani et al. .................. 359/291 |
| 5,821,624 A | * | 10/1998 | Pasch .................. 257/776 |
| 5,830,565 A | * | 11/1998 | Budnaitis .................. 428/318.4 |
| 5,834,835 A | * | 11/1998 | Maekawa .................. 257/680 |
| 5,936,305 A | * | 8/1999 | Akram .................. 257/723 |

FOREIGN PATENT DOCUMENTS

JP 3-154397 * 7/1991

* cited by examiner

Primary Examiner—Alexander O. Williams
(74) Attorney, Agent, or Firm—Dickstein Shapiro Morin & Oshinsky LLP

(57) ABSTRACT

A method and apparatus is provided to identify defective laminate objects or package substrates having mounting sites for integrated circuit dies during the package substrate fabrication process. A hole is drilled or punched within the boundary of an individual package substrate contained within a larger laminate substrate and covered with a material layer coating composed of an opaque material such as a resist. The coating may then be selectively applied or removed at a later point during the fabrication process dependent upon whether the package substrate has been classified as defective or non-defective. After specific package substrates have been marked as defective, a light source and light collector are supplied to the fabrication process on opposite sides of the wafer. By shining the light source on the laminate substrate, defective package substrates can be identified by the passage of light through the hole which is no longer covered with resist. A package substrate may have one or many holes corresponding to one or many die mounting sites. Therefore, defective package substrates may be identified through the use of a simple light source and light collector and without the need for unnecessary expensive optical recognition or sorting machinery.

24 Claims, 7 Drawing Sheets

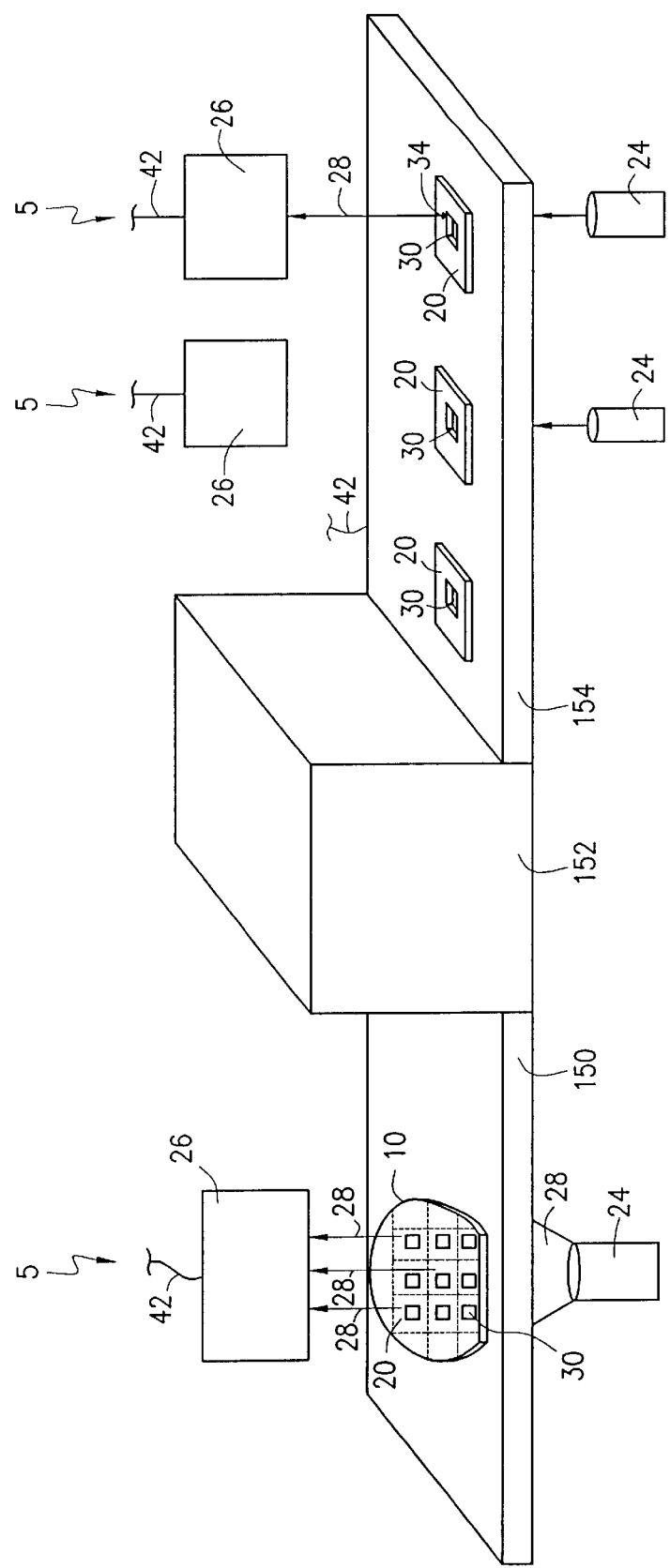

INTEGRATED CIRCUIT SUBSTRATE HAVING THROUGH HOLE MARKINGS TO INDICATE DEFECTIVE/NON-DEFECTIVE STATUS OF SAME

BACKGROUND OF THE INVENTION

1. Field of the Invention

This invention relates to the testing of laminated substrates used in packaging integrated circuit dies and, in particular, to a method and apparatus for identification of defective laminated substrates.

2. Description of the Related Art

Integrated circuit chips or dies are susceptible to damage and failure when exposed to environmental conditions such as heat and moisture. To protect a die and, therefore, extend its life span, it is packaged within a protective barrier of material which contains metallic pads and leads to provide electrical connection to the die itself. The fabrication of the package may involve the creation of a substrate capable of receiving an integrated circuit die and providing electrical connections to that die. Package substrates are typically laminate structures of insulating material having a die mounting site which secures the die and contains metal lines or layers which are fashioned to electrically connect the die to leads which extend outside the package. The leads may be contacted from outside the insulating material and used to connect the packaged die to another element, for example a circuit board. Advancements in processing techniques of package substrates have allowed both laminate substrates to be almost fully processed in an array and then divided from the array into numerous individual package substrates, and for one or multiple die mounting sites to be present on a single package substrate.

The mounting of the dies within a package may be accomplished by placing the dies on a package substrate which is typically a ceramic or other insulating material combined with metal lines and/or layers to provide appropriate electrical connections. The package substrate is a laminate construction. In order to shield the dies, they are generally encased within the package by methods such as epoxy or resin encapsulation or by sealing in a container which is vacuum-sealed or filled with an inert gas.

Several different packaging technologies are currently in use for semiconductor manufacturing, including thin quad flat packs (TQFPs), ball grid arrays (BGAs), tape automated bonding (TAB), ultra-thin packages, bare chips or chip-on-board (COB), flip-chip assemblies and multichip modules (MCMs).

BGA packages, for example, are common and are generally constructed using a plastic or ceramic laminated substrate as shown in FIG. 5. The package substrate 20 is a laminate construction of a conducting (metal) patterned layer 54, electrically insulating layers 52 and 56, and conducting ball grid array 62. A die mounting site 30 is formed in the layer 52 to accept an IC die. Insulating layers 52 and 56 may be, for example, a ceramic or plastic material having vias through which an electrical connection is made between the contacts 58 of the die site 30 and the ball grid array 62 through the metal pattered layer 54. Electrical connections to the die itself are made through the contacts 58. The die is typically wire bonded to the contacts 58 within the die mounting site 30. The die is generally face up, with its back side bonded to the substrate package 20 through the wire bonds and, in some cases, through the use of an adhesive. The ball grid array 62 is comprised of a plurality of individual solder balls 64 which provide electrical contact to a circuit board or another package.

Semiconductor packages are subject to a variety of heating and depositing processes during fabrication. Accordingly, a package substrate is susceptible to defects arising from any step in the fabrication process. A defective package substrate may render a die useless even if the die itself is flawless. Testing for defects within package substrates may occur at any point in the processing prior to introduction of the die. Commonly, it is accomplished after processing of the laminate layers is complete and prior to introduction of the die. Testing may be accomplished through a variety of methods, the most common being visual inspection by a human operator and by electronic probe testing. Visual inspection is accomplished by an operator utilizing a high resolution image of the die mounting sites on the laminate substrate to detect and analyze defects. Such a process is both expensive and time-consuming. In-line testing is also accomplished through the use of electronic probes which contact the die connection points of the individual die mounting sites within the laminated substrate and check for proper operation to determine the presence or absence of defects.

Once an incapacitating defect has been found on an individual die mounting site, that die mounting site must be marked for analysis, repair, and/or destruction. Normally, this is accomplished by marking the die mounting site with a unique identification such as a print or ink media based tag. The laminated substrate may then be scored and separated into individual package substrates each having at least one die mounting site. The package substrates containing defective die mounting sites which have been marked as defective are eventually discarded or repaired. To implement this system, a code mark, such as a bar code, is applied to each individual package substrate or die mounting site prior to testing. After testing, the code mark is read and stored in a computer memory along with a designation of test results as defective or non-defective. The code mark is unique to each die mounting site and, therefore, the processing system may read the code mark at later time and redirect the defective die mounting sites to a repair station or a discard bin. However, ink-based marks or codes on the surfaces of substrates are subject to obfuscation and destruction during the laminate fabrication and/or package assembly processes.

Another identification method is to retain order within the processing system by assigning each package substrate or die mounting site a unique number in that system. If a defect is found in a die mounting site that has been assigned, for example, the number 23, the system will later skip or discard the $23^{rd}$ die mounting site and associated substrate within the line. Such a process, however, requires complicated sorting and processing machinery to retain the order which has been assigned.

Automated processes for the analysis, repair, and destruction of defective package substrates are preferred in light of the possible increases in efficiency and cost reduction it makes possible. Identifying the defective package substrates is essential within such a system. Currently no method or apparatus allows for in-line identification of defective individual package substrates without the use of complicated machinery or computing resources.

SUMMARY OF THE INVENTION

The present invention provides a method and apparatus that is able to overcome some of the problems attendant the marking and subsequent analysis of defective laminate package substrates.

The above and other features and advantages of the invention are achieved by providing an apparatus for the production of at least one hole within the boundary of an individual package substrate containing at least one die mounting site prior to the mounting of integrated circuit dies to the die mounting site(s). This hole is covered with a material layer coating composed of an opaque material such as a resist. The coating may then be selectively removed at a later point during the fabrication process dependent upon whether the individual package substrate has been classified as defective or non-defective. Later equipment can read the state of the hole as covered or not to determine the status of the individual package substrate as defective or not.

After an individual substrate has been marked as defective, a light source and light collector are used in the package fabrication process arranged on opposite sides of the package substrate to determine whether the hole is blocked or not by the resist, and thus whether the individual package substrate is defective or not. Therefore, defective individual package substrates may be identified through the use of a simple light source and light collector and without the need for a manual inspection or use of complicated optical recognition equipment.

As a variant, for individual substrates employing multiple die mounting sites, it is also possible to provide a hole for each such site which is covered or not and thus be able to characterize each die mounting site on the individual package substrate as defective or not.

The above and other advantages and features of the present invention will be better understood from the following detailed description of the preferred embodiment which is provided in connection with the accompanying drawings.

BRIEF DESCRIPTION OF THE DRAWINGS

FIG. 3 is a cross-sectional view of a package substrate production line using the invention of FIG. 1;

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention. Wherever possible, like numerals are used to refer to like elements and functions in the various figures of the drawings and between the different embodiments of the present invention.

Figure 1A:
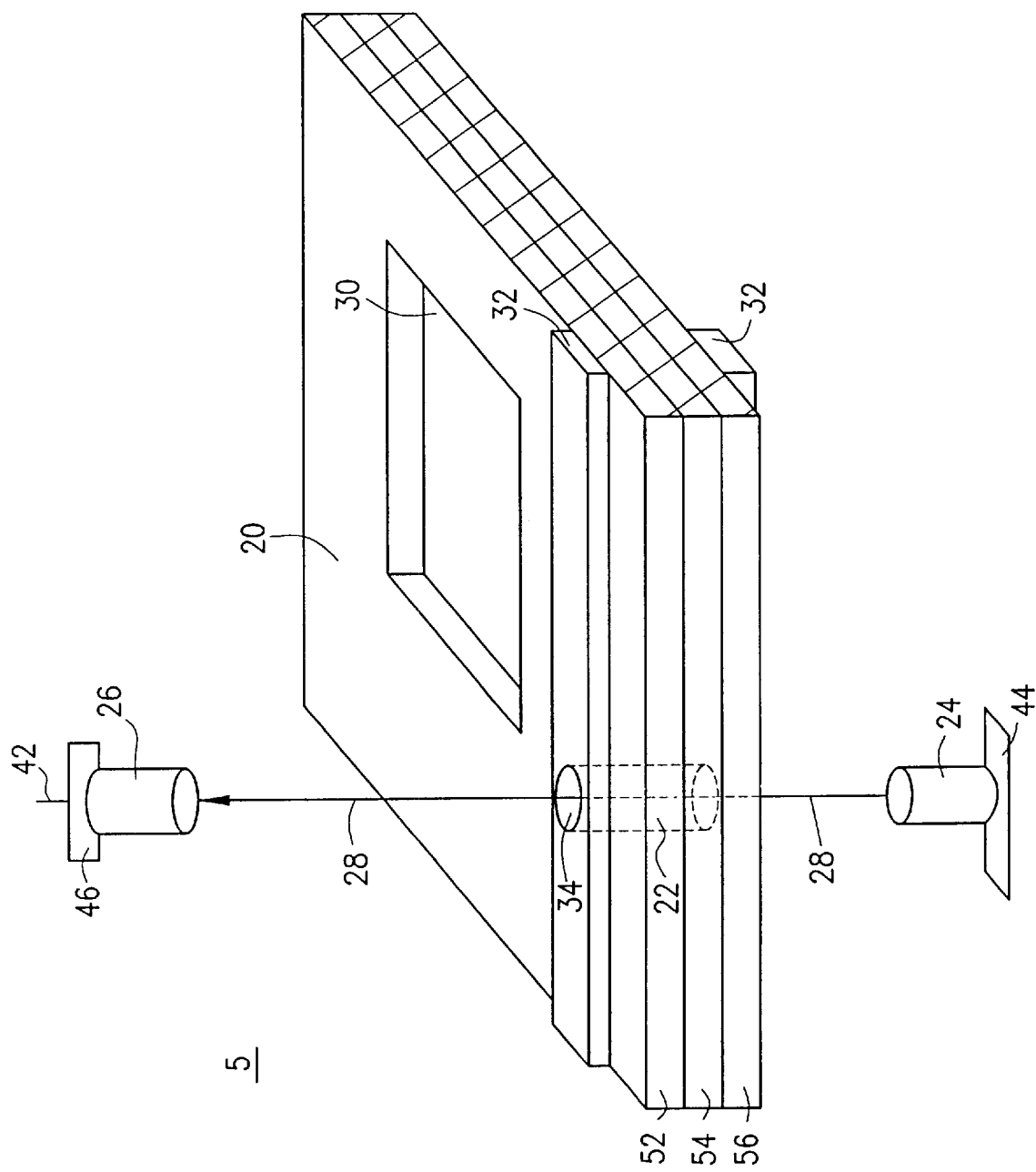
FIG. 1a is a perspective view of a preferred embodiment of the present invention.
Figure 5:
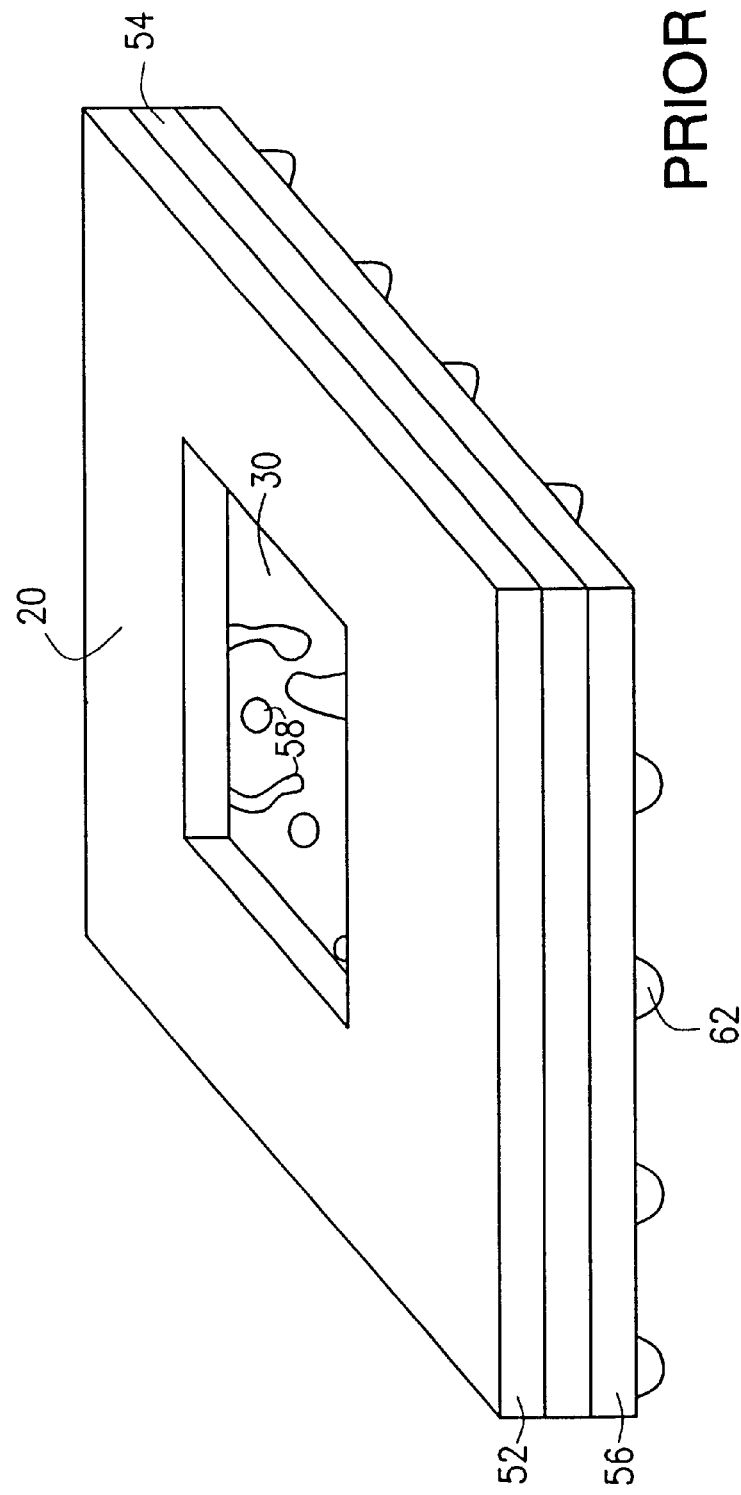
FIG. 5 is a perspective view of a conventional ball grid array (BGA) packaging substrate.

A defective package substrate detection system 5 in accordance with the present invention is illustrated generally in FIG. 1a. The detection system 5 is a portion of an automated package substrate fabrication line for processing a package substrate 20. The individual package substrate 20 shown in FIG. 1a is of laminated construction containing the same insulating layers 52, 56, conductive pattern layer 54 and die mounting site 30 as discussed previously with respect to FIG. 5. In addition, a hole 22 is formed through the laminated substrate 20. The laminated substrate 20 further contains a coating layer strip 32 on one or both surfaces of substrate 20 which covers hole 22. Package substrate 20 is preferably used to form a thin quad flat package (TQFP), a ball grid array (BGA) package, a tape automated bonding (TAB) package, or an ultra-thin package.

The coating 32 is selectively removed from a location on the substrate 20 covering hole 22 in order to indicate the status of substrate 20 as defective or not. For example, if after manual inspection or electrical testing substrate 20 is deemed defective, coating layer 32 is removed from covering hole 22. Thus, light can pass through hole 22 to indicate a defective substrate. A light source 24 produces a light beam 28 which passes through hole 22 to intersect with a surface of a light detector 26 which is capable of detecting light beam 28. The light beam 28 may have a cross-sectional area substantially equivalent to the cross-sectional area of the hole 22 or may have a cross-sectional area sufficient to intersect one entire major surface of package substrate 20. A defective substrate detection employs the light source 24 and light detector 26. The system can be set so that an unblocked hole 22 indicates a defective substrate 20, as in the example just given, or it can be set so that a blocked hole 22 indicates a defective substrate in which case non-defective substrate will have the coating 32 removed from covering hole 22. In either case, light beam 28 will be used and the signal output of light detector 26 will indicate whether the substrate 20 has been marked as defective or not. If the detector 26 provides an output signal indicating a defective substrate 20 it will either be repaired or remain unused and will be routed properly by an operator or machine to either a repair station or to a discard bin.

Figure 1B:
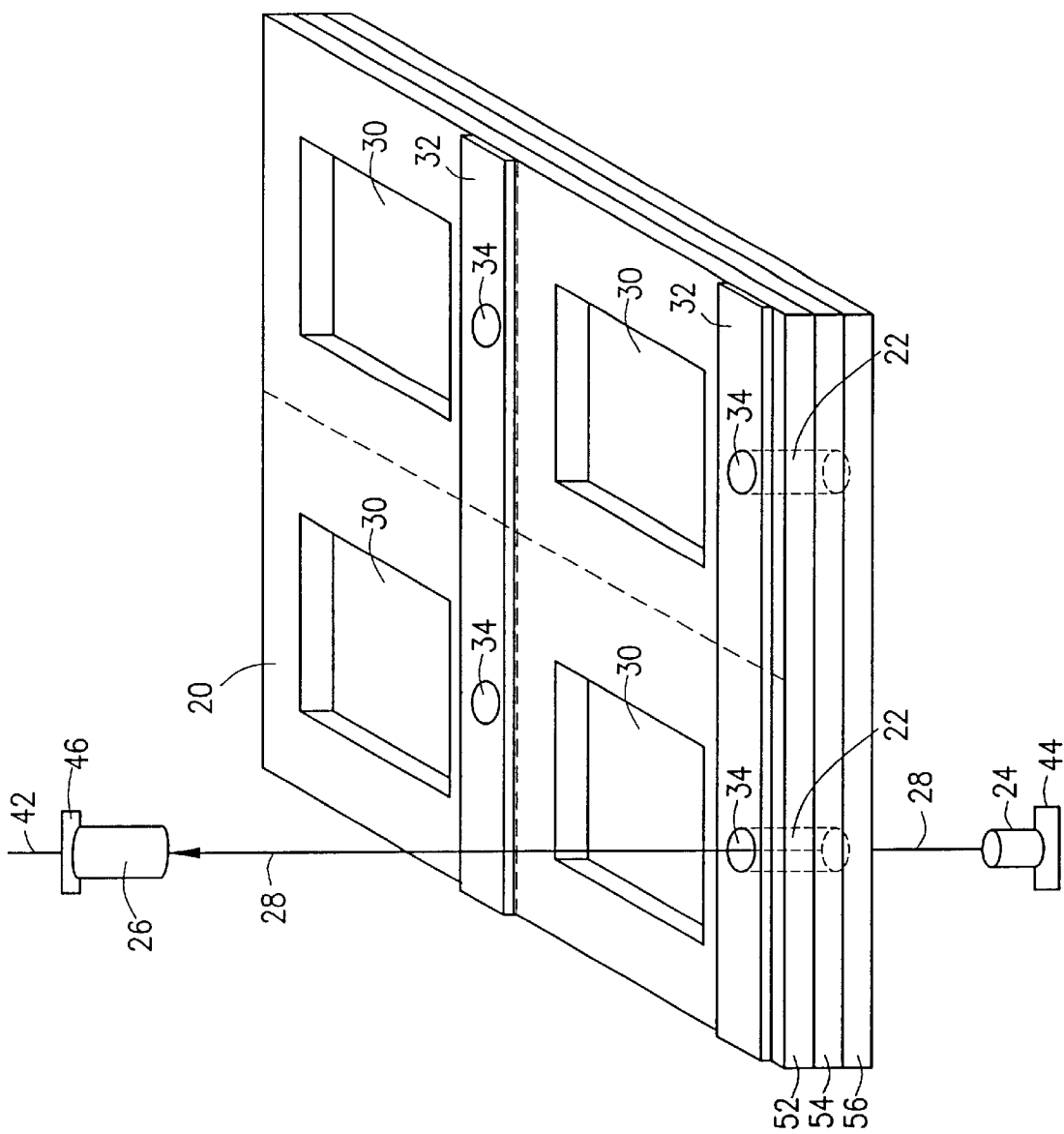
FIG. 1b is a perspective view of another preferred embodiment of the present invention.

In another embodiment of the invention shown in FIG. 1b, package substrate 20 has a plurality of die mounting sites 12, 14, 16, 18 each capable of mounting a die and each having a corresponding marking hole 22 which extends through the package substrate 20. Coating layer strips 32 are deposited on one or both sides of the package substrate 20 such that the holes 22 are covered. The coating layer strip 32 is removed from covering the holes 22, or left intact, depending on whether the individual mounting sites are found to be defective or not. With this arrangement, even if one die mounting site is found to be defective it may be possible to still use the remaining non-defective mounting sites 30. Accordingly, each mounting site 30 is provided with a respective marking hole 22 and associated coating layer strip 32 which can be selectively removed from carrying a hole to mark the status of the mounting site as defective or not. Although the package substrate 20 is shown in FIG. 1b to have a hole 22 and hole 34 for each die mounting site area 12, 14, 16, or 18, only one hole 22 may be formed for the package substrate 20 having a plurality of die mounting sites 30. In such a case, if any die mounting site 30 is defective, the marking hole 22 is blocked or not by the coating layer strip 32 to expose hole 22 and indicate the status of substrate 20 as defective or not.

Figure 2:
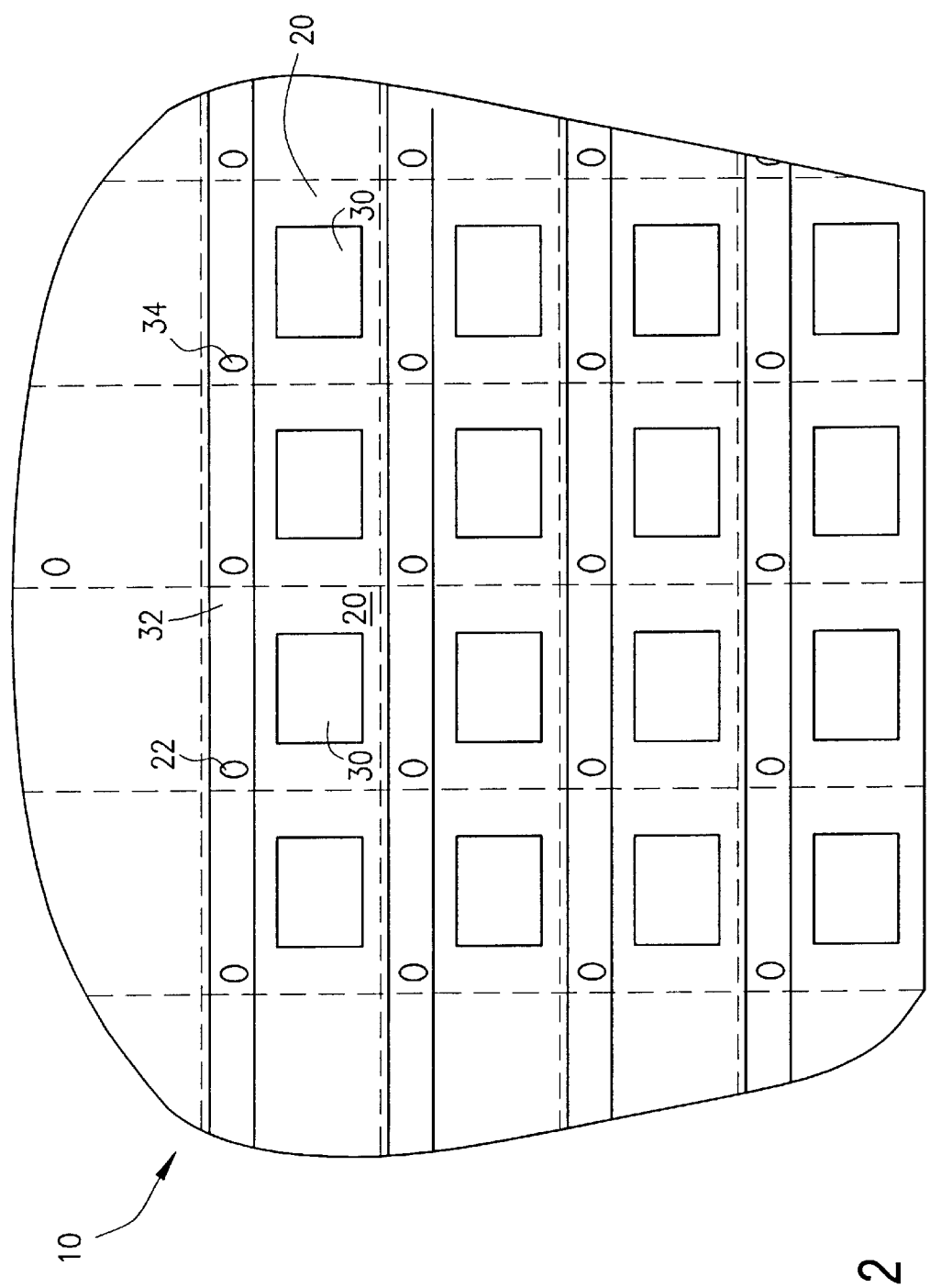
FIG. 2 is a perspective view of a package substrate prepared in accordance with a preferred embodiment of the present invention.

FIG. 2 shows a laminate substrate array 10 which has two major processable surfaces and is composed of a plurality of individual substrates having respective die mounting sites 30 which will eventually be diced to form a plurality of individual package substrates 20, each of which contains one die mounting site 30. At least one hole 22 extends between the major surfaces of each individual package substrate 20 within the laminate substrate 10. A coating layer strip 32 is placed over the array and on at least one major surface of each package substrate 20 such that it covers the hole 22. To prevent the fouling of the die mounting site 30, neither the holes 22 nor the coating layer strip 32 are located on the portions of the package substrates 20 which contain electrical connections for a die mounting site 30.

The laminate substrate 10 may be constructed of any material suitable for use as a package substrate for IC chips, preferably a rigid or flexible film laminate comprised of layers including, for example, ceramic, silicon, silicon dioxide, metal, or reinforced plastic with thermal vias e.g., glass reinforced epoxy, glass reinforced polyimide, glass reinforced polyester, glass reinforced PTFE, polyimide, polyester, and other high temperature thermoplastics, alone or in conjunction with glass or other reinforcing materials or metal cladding which may be further laminated to heat sinks, shielding materials, and a conducting sheet which provides electrical contact to an IC die. The coating layer strip 32 is preferably a resist which is capable of adhering to the surface of the laminate substrate 10 and is substantially opaque. A resist is a coating material normally used in package substrate fabrication processes to mask or to protect selected areas of a pattern from the action of an etchant, solder, or plating. The coating layer strip 32 may be, for example, a soldermask or solder resist normally used in the coating of material to protect or mask conductive traces or areas of a package substrate against solder bridging. Alternatively, the coating layer strip 32 may be a plating resist normally used to prevent the plating of the covered areas. Plating resists may be screened-on materials or may be dry-film photopolymer resists. In addition, dry-film resists may be used as the coating layer strip 32 in the form of laminated photosensitive sheets specifically designed for use in the manufacture of printed circuit boards and chemically machined parts. Dry-film resists are resistant to various electroplating and etching processes. It is essential that the coating layer strip 32 be able to be selectively removed through techniques such as ashing, the removal of photoresist from a substrate by high temperature oxidation, from selective areas, e.g. from the area over the holes 22, as shown in FIG. 2.

The coating layer strip 32 exists on one or both sides of the laminate substrate 10 and forms a barrier to the passage of light beam 28 through hole 22 in the package substrates 20 of laminate substrate 10. The coating layer strip 32 must have a combination of opacity and thickness sufficient to block the passage of light beam 28 through the holes 22. The coating layer strip 32 is selectively removed on a package substrate 20 having a defective die mounting site 30 to expose the hole 22 which allows light beam 28 to pass through the package substrate 20. Removal may occur through, ashing, chemical wash, or similar techniques known in the art. The coating layer strip 32 is not removed from non-defective package substrates 20 and, therefore, light beam 28 is blocked by the coating 32. As noted, however, it is also possible to remove the coating layer strip 32 over holes of non-defective substrates, if desired.

The light source 24 may be any device capable of producing a light beam 28 directed at the holes 22 of the laminate substrate 10. Light source 24 may be a white light source or a wavelength-specific light source, such as a laser. In some cases, a wavelength-specific light source 24 may be used if it is important to reduce the possibility of false readings at the detector 26 from other light sources used in the package substrate fabrication process.

In one embodiment of the present invention shown in FIG. 1, the light source 24 is mounted onto a mount 44 and may be either stationary or capable of movement. Detector 26 is any device capable of detecting a light beam 28 originating from light source 24, preferably a photovoltaic cell activated by the wavelength of light beam 28. The detector 26 is similarly mounted to a mount 46 and may be stationary or capable of movement. In the preferred arrangement shown in FIG. 2, the light source 24 on mount 44 is located below the laminate substrate 10 or package substrate 20 by a distance dictated by the existing package substrate fabrication production line into which the current system is integrated. The light detector 26 on mount 46 is located above the laminate substrate 10 or package substrate 20 by a distance dictated by the existing package substrate fabrication production line into which the current system is integrated and aligned with the light source 24. Backlighting of the laminate substrate 10 or package substrates 20 allows for a simple and cost-efficient integration of the detection system 5 into currently existing package substrate fabrication production lines.

A portion of a package substrate fabrication production line is representatively shown in FIG. 3. A conveyor 50 transports a laminate substrate 10 containing a plurality of individual package substrates 20 to a dicer 52. The dicer cuts the laminate substrate 10 into individual package substrates 20 each having at least one die mounting site 30 which are then transported on conveyer 54 for further processing. The detection system 5 of the present invention may be implemented at any stage of the package substrate fabrication process including prior to dicing and after dicing of the laminate substrate 10. The conveyors 50 and 54 are constructed to allow the light beam 28 from light source 24 to pas s through to the laminate substrate 10. This may be accomplished by the use of a transparent conveyors 50, 54 or through openings in the conveyors 50, 54. The system 5 may include a single light source 24 and detector 26 or may be comprised of a number of light sources 24 and detectors 26 as shown in FIG. 3. The size of the light sources 24 and detectors 26 may vary in accordance with the area of the laminate substrate 10 or package substrates 20. The use of multiple light sources 24 and detectors 26 may be desirable so that multiple package substrates 20, laminate substrates 10, or multiple die mounting sites 30 on a single package substrate 20 may be tested at the same time. In addition, the light sources 24 and detectors 26 may be placed in various positions within a package substrate fabrication production line to assist in both the classification of die mounting sites 30 as being either defective or non-defective or to assist in the analysis of defect placement on a laminate substrate 10. Upon detection of a package substrate 20 having a defective die mounting site 30, the detector 26 sends an output signal on line 42 signaling the conveyor or human operator to re-route the defective package substrate 20 to a repair station or discard bin.

Figure 4A:
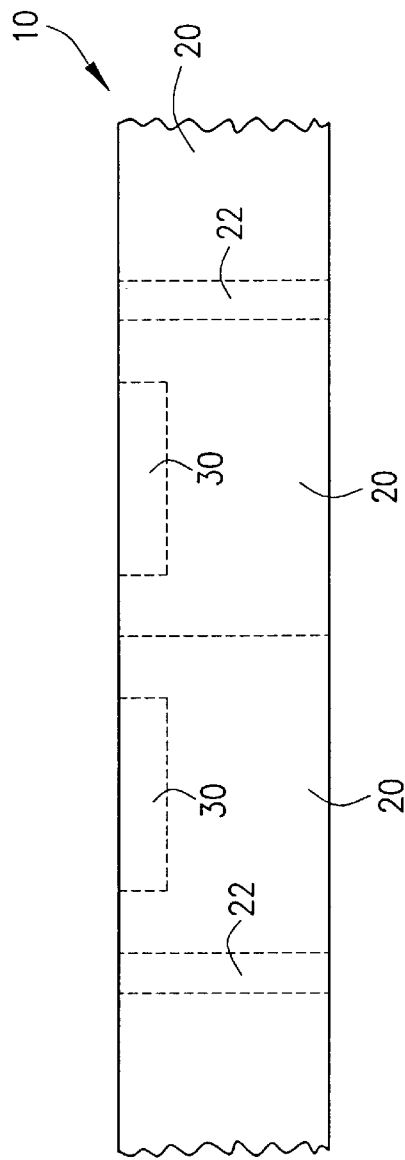
FIGS. 4a–c are cross sectional views depicting the fabrication of a package substrate shown in FIG. 2.

The process for forming the defective wafer identification detection system 5 will next be described with reference to FIGS. 4a–4c. FIG. 4a shows a portion of the laminate substrate 10, having two major surfaces, in a preliminary stage of construction having a plurality of defective die mounting sites 30 on package substrates 20 and non-defective die mounting sites 30 on package substrates 20. The number and position of the defective die mounting sites 30 and non-defective die mounting sites 30 will vary from package substrate to package substrate. The laminate substrate 10, which may ultimately yield many package substrates 20, is subjected to the formation of holes 22 which extend through each package substrate 20. The holes 22 are positioned on the laminate substrate 10 so that they do not intersect or contact the die mounting site 30 of the package substrates 20. Formation of the holes 22 may be formed by etching, drilling or punching techniques with the holes 22 extending through the laminate substrate 10 leaving openings in both major surfaces of the package substrates 20. Though the holes 22 shown in FIG. 1 are round, the holes may have any shape sufficient to allow light to pass from one end of a hole 22 through the laminate substrate 10 to the other end of hole 22.

Figure 4B:
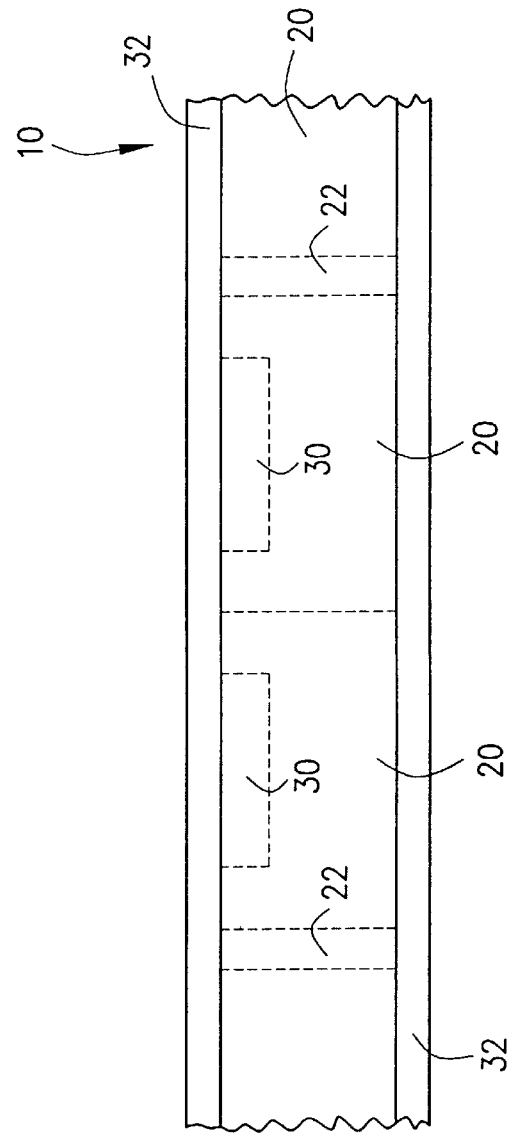

FIG. 4b shows the laminate substrate 10 in a second preliminary stage of construction having package substrates 20 coated on both major surfaces with a coating layer strip 32, preferably a resist coating, covering the holes 22. The coating layer strip 32 has a thickness and/or opacity sufficient to block the passage of light through the holes 22. Alternatively, coating layer strip 32 may be formed on only one or a part of one or both surfaces of the laminate substrate 10, as desired. For purposes of further description of the invention, a laminate substrate 10 having a coating layer strip 32 on both sides of the laminate substrate 10 will be discussed.

Figure 4C:
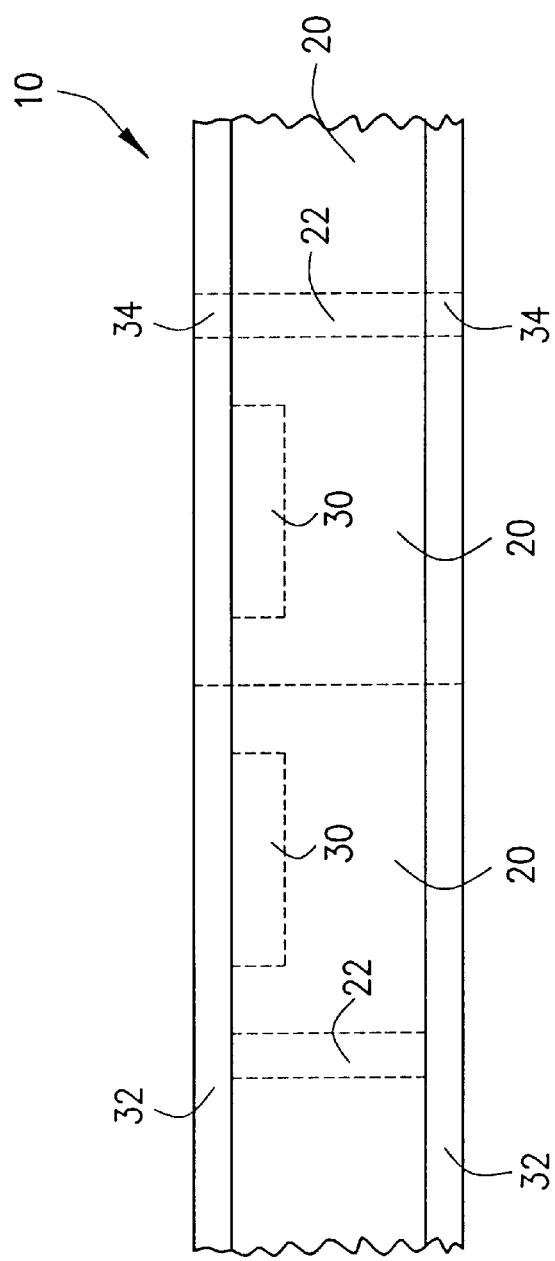

Referring now to FIGS. 4b and 4c, once the coating layer strips 32 have been formed, the selective removal of a portion of the coating layer strips 32 may be carried out. Selective removal occurs when a die mounting site 30 is identified as defective through testing means known in the art, for example by electronic probe testing of the conducting lines within a die mounting site 30. FIG. 4c shows the laminate substrate 10 after removal of the coating layer strip 32 from over the holes 22 on package substrate 20 having a defective die mounting site 30. The coating layer strip 32 remains on the non-defective package substrate 20 covering corresponding hole 22. Removal of the coating layer strips 32 from the defective die mounting sites 30 of the package substrate 20 may be accomplished by an ashing or chemical wash process which is directed at the holes 22 which correspond to defective package substrates 20 such that only the holes 22 corresponding to defective package substrates 20 are exposed. The formation and subsequent removal of the coating layer strip 32 from covering the holes 22 of defective package substrates 20 may be accomplished at any time during the fabrication process of the wafer after the testing and classification process during which the package substrates 20 are determined to be defective.

In another embodiment of the invention, the laminate substrate 10 is diced or cut into individual package substrates 20 prior to die mounting sites 30 being identified as defective or non-defective. The package substrates 20 may then be passed over a light source 24 and under a detector 26. If a light beam 28 from light source 24 is detected by detector 26 through hole 22 of a defective package substrate 20 which has had coating 32 selectively removed to expose hole 22, the package substrate 20 is identified as defective and can be redirected to a repair station or a discard bin.

Although the present invention has been illustrated using one hole 22 which is selectively covered or not covered to identify a defective package substrate or a die mounting area thereon, it is also possible to provide a plurality of holes 22 for each package substrate 20 or die mount area. The plurality of holes 22 may be selectively covered or uncovered, as described above, to form a binary code, e.g. covered holes 22 representing "0" and uncovered holes 22 representing "1", or vice versa. By reading the binary code using the light source 24 to produce a pattern of light and dark on the detector 26, the binary code of each package substrate 20 may be used to represent a unique identification for a specific package substrate 20, a code corresponding to the type or location of defects within the package substrate 20, or a combination of both.

With the present invention, the identification of defective package substrates 20 by a human or machine at any stage of a package substrate fabrication process is simplified and does not suffer from the marking reading problems attendant in current ink-package substrate systems and allows for a cost-effective method of identification without the need for sophisticated equipment which would require extensive revamping of current production line systems.

It should be readily understood that the invention is not limited to the specific embodiments described and illustrated above. Rather, the invention can be modified to incorporate any number of variations, alterations, substitutions or equivalent arrangements not heretofore described, which are commensurate with the spirit and scope of the invention. Accordingly, the invention is not limited by the foregoing description, but is only limited by the scope of the appended claims.

What is claimed as new and desired to be protected by Letters Patent of the United States is:

1. An integrated circuit package substrate for mounting at least one die, said package substrate having at least one hole, said at least one hole being blocked by a light blocking material which is selectively removable to indicate the status of said package substrate as defective or non-defective.

2. The package substrate of claim 1, wherein said light blocking material covers said at least one hole.

3. The package substrate of claim 1, wherein said light blocking material is initially applied to said package substrate and is selectively removed from covering said at least one hole to identify said package substrate as defective.

4. The package substrate of claim 1, wherein said light blocking material is present over said at least one hole for a package substrate which is non-defective.

5. The package substrate of claim 1, wherein said light blocking material is present over said at least one hole for a package substrate which is defective.

6. The package substrate of claim 1, wherein said light blocking material is located on at least one side of said package substrate.

7. The package substrate of claim 1, wherein said light blocking material is located on both sides of said package substrate.

8. The package substrate of claim 1, wherein said light blocking material is provided as a strip on said package substrate.

9. The package substrate of claim 1, wherein said light blocking material is formed of an opaque material.

10. The package substrate of claim 1, wherein said at least one hole is located outside of the area of said package substrate containing a mounting site and electrical connections for an integrated circuit die.

11. The package substrate of claim 1, further comprising a plurality of holes, each of said holes being blocked by a light blocking material which is selectively removable to form a code pattern.

12. The package substrate of claim 11, wherein said code pattern is representative of the existence and location of defects on said package substrate.

13. The package substrate of claim 11, wherein said code pattern is arranged to uniquely identify said package substrate.

14. The package substrate of claim 1, wherein said integrated circuit package has a plurality of mounting sites for integrated circuit dies.

15. The package substrate of claim 14, wherein said integrated circuit package has one hole for said plurality of mounting sites.

16. The package substrate of claim 14, wherein said integrated circuit package has one hole for each of said plurality of mounting sites.

17. An integrated circuit package substrate comprising a plurality of die mounting sites each for mounting an integrated circuit die, said package substrate having a hole, said hole being blocked by a light blocking material which is selectively removable to indicate the status of said package substrate as defective or non-defective.

18. An integrated circuit package substrate comprising a plurality of die mounting sites each for mounting an integrated circuit die, each of said die mounting sites having a hole, said hole being blocked by a light blocking material which is selectively removable to indicate the status of said package substrate as defective or non-defective.

19. An integrated circuit package substrate array comprising a plurality of separable package substrates for mounting at least one integrated circuit die, each of said package substrates having at least one hole, said at least one hole being blocked by a light blocking material which is selectively removable to indicate the status of said package substrate as defective or non-defective.

20. The integrated circuit package substrate array of claim 19, wherein said light blocking material is present over said at least one hole for a package substrate which is non-defective.

21. The integrated circuit package substrate array of claim 20, wherein said light blocking material is present over said at least one hole for a package substrate which is defective.

22. The integrated circuit package substrate array of claim 20, wherein each of said package substrates has a plurality of mounting sites for said integrated circuit dies.

23. The integrated circuit package substrate array of claim 22, wherein each of said package substrates has one hole per said plurality of mounting sites.

24. An integrated circuit package substrate for mounting at least one die, said package substrate having a plurality of holes, each of said holes being blocked by a light blocking material which is selectively removable from at least one of said holes to form a binary code pattern to indicate the status of said package substrate as defective or non-defective.

* * * * *